United States Patent
Hara et al.

(10) Patent No.: US 11,422,190 B2
(45) Date of Patent: Aug. 23, 2022

(54) STORAGE BATTERY SYSTEM CHARGING CONTROL DEVICE, STORAGE BATTERY SYSTEM, AND STORAGE BATTERY CHARGING CONTROL METHOD

(71) Applicant: Mitsubishi Electric Corporation, Chiyoda-ku (JP)

(72) Inventors: Satoshi Hara, Chiyoda-ku (JP); Hisatoshi Fukumoto, Chiyoda-ku (JP); Toshihiro Wada, Chiyoda-ku (JP); Takahito Ida, Chiyoda-ku (JP); Hiroki Ishihara, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 403 days.

(21) Appl. No.: 16/607,009

(22) PCT Filed: Mar. 5, 2018

(86) PCT No.: PCT/JP2018/008309
§ 371 (c)(1),
(2) Date: Oct. 21, 2019

(87) PCT Pub. No.: WO2019/016998
PCT Pub. Date: Jan. 24, 2019

(65) Prior Publication Data
US 2020/0132774 A1 Apr. 30, 2020

(30) Foreign Application Priority Data
Jul. 19, 2017 (JP) .............................. JP2017-139651

(51) Int. Cl.
*G01R 31/392* (2019.01)
*G01R 31/36* (2020.01)
(Continued)

(52) U.S. Cl.
CPC ............ *G01R 31/36* (2013.01); *H02J 7/0068* (2013.01); *H02J 7/04* (2013.01)

(58) Field of Classification Search
CPC .. G01R 31/36; G01R 31/382; G01R 31/3828; G01R 31/3832; G01R 31/3833;
(Continued)

(56) References Cited

U.S. PATENT DOCUMENTS

| 2010/0019729 A1* | 1/2010 | Kaita ........................ H02J 7/02 320/134 |
| 2013/0069598 A1 | 3/2013 | Tanaka et al. |
| 2015/0285869 A1* | 10/2015 | Wada ................. G01R 31/3828 702/63 |

FOREIGN PATENT DOCUMENTS

| CN | 103942133 A | * | 7/2014 | ............... G06F 1/26 |
| JP | 2013-65481 A | | 4/2013 | |
| KR | 20120082965 A | * | 7/2015 | ............ H01M 10/48 |

OTHER PUBLICATIONS

Soo K, KR-20120082965-A Machine Translation, Jul. 2015 (Year: 2015).*

(Continued)

*Primary Examiner* — Drew A Dunn
*Assistant Examiner* — Pamela J Jeppson
(74) *Attorney, Agent, or Firm* — Xsensus LLP

(57) ABSTRACT

In a storage battery system charging control device, on the basis of estimated temperature data until the end of life of a storage battery calculated by a power estimation unit, an ambient temperature estimation unit, and a temperature estimation unit, and a deterioration coefficient stored in a data storage unit, a capacity retention calculation unit sequentially calculates capacity retention data with respect to each state of charge until the end of life of the storage battery, using the state of charge as a parameter. A cumulative capacity calculation unit calculates a cumulative capac- (Continued)

ity corresponding to each state of charge, on the basis of the rated capacity of the storage battery and the capacity retention data. A charging control voltage determination unit determines charging control voltage on the basis of the cumulative capacities calculated by the cumulative capacity calculation unit.

10 Claims, 5 Drawing Sheets

(51) Int. Cl.
    *H02J 7/00*     (2006.01)
    *H02J 7/04*     (2006.01)

(58) Field of Classification Search
    CPC ............ G01R 31/3835; G01R 31/3842; G01R 31/387; G01R 31/388
    See application file for complete search history.

(56) References Cited

OTHER PUBLICATIONS

Chen Y, CN-103942133-A Machine Translation, Jul. 2014 (Year: 2014).*
International Search Report dated Mar. 27, 2018 in PCT/JP2018/008309 filed Mar. 5, 2018.

* cited by examiner

| | $T_1$ | ... | $T_k$ | ... | $T_m$ | ... | $T_n$ |
|---|---|---|---|---|---|---|---|
| $SOC_1$ | $a_{11}$ | ... | $a_{1k}$ | ... | $a_{1m}$ | ... | $a_{1n}$ |
| ⋮ | ⋮ | ⋱ | ⋮ | ⋱ | ⋮ | ⋱ | ⋮ |
| $SOC_k$ | $a_{k1}$ | ... | $a_{kk}$ | ... | $a_{km}$ | ... | $a_{kn}$ |
| ⋮ | ⋮ | ⋱ | ⋮ | ⋱ | ⋮ | ⋱ | ⋮ |
| $SOC_m$ | $a_{m1}$ | ... | $a_{mk}$ | ... | $a_{mm}$ | ... | $a_{mn}$ |
| ⋮ | ⋮ | ⋱ | ⋮ | ⋱ | ⋮ | ⋱ | ⋮ |
| $SOC_n$ | $a_{n1}$ | ... | $a_{nk}$ | ... | $a_{nm}$ | ... | $a_{nn}$ |

| SOC | VOLTAGE |
|---|---|
| 0 | 2.501 |
| 5 | 3.2915 |
| 10 | 3.5536 |
| 15 | 3.6669 |
| 20 | 3.7359 |
| 25 | 3.7966 |
| 30 | 3.8464 |
| 35 | 3.8725 |
| 40 | 3.8916 |
| 45 | 3.9094 |
| 50 | 3.9278 |
| 55 | 3.9482 |
| 60 | 3.9714 |
| 65 | 4.0002 |
| 70 | 4.04 |
| 75 | 4.0544 |
| 80 | 4.0677 |
| 85 | 4.0827 |
| 90 | 4.1027 |
| 95 | 4.1348 |
| 100 | 4.1999 |

FIG. 6

| | | CYCLE INTERVAL | | | | |
| --- | --- | --- | --- | --- | --- | --- |
| | | 0~400 | 400~800 | 800~1200 | 1200~1600 | 1600~2000 |
| | | TEMPERATURE (° C) | | | | |
| | | 45 | 25 | 5 | 25 | 45 |
| SOC(%) | 0 | 0.000 | 0.000 | 0.000 | 0.000 | 0.000 |
| | 5 | 0.556 | 0.256 | 0.209 | 0.193 | 0.132 |
| | 10 | 1.102 | 0.510 | 0.417 | 0.386 | 0.261 |
| | 15 | 1.636 | 0.764 | 0.625 | 0.577 | 0.386 |
| | 20 | 2.153 | 1.016 | 0.833 | 0.767 | 0.506 |
| | 25 | 2.670 | 1.269 | 1.040 | 0.957 | 0.625 |
| | 30 | 3.153 | 1.518 | 1.247 | 1.145 | 0.733 |
| | 35 | 3.619 | 1.767 | 1.454 | 1.331 | 0.836 |
| | 40 | 4.052 | 2.012 | 1.660 | 1.514 | 0.928 |
| | 45 | 4.502 | 2.259 | 1.867 | 1.698 | 1.025 |
| | 50 | 4.875 | 2.499 | 2.071 | 1.877 | 1.097 |
| | 55 | 5.223 | 2.738 | 2.276 | 2.053 | 1.161 |
| | 60 | 5.508 | 2.971 | 2.479 | 2.224 | 1.204 |
| | 65 | 5.844 | 3.209 | 2.683 | 2.399 | 1.264 |
| | 70 | 6.027 | 3.434 | 2.884 | 2.562 | 1.274 |
| | 75 | 6.173 | 3.655 | 3.084 | 2.721 | 1.271 |
| | 80 | 6.207 | 3.868 | 3.281 | 2.871 | 1.231 |
| | 85 | 6.350 | 4.090 | 3.482 | 3.031 | 1.229 |
| | 90 | 6.211 | 4.288 | 3.676 | 3.167 | 1.132 |
| | 95 | 6.014 | 4.482 | 3.869 | 3.299 | 1.017 |
| | 100 | 5.618 | 4.659 | 4.058 | 3.414 | 0.837 |

UNIT [kWh]

STORAGE BATTERY SYSTEM CHARGING CONTROL DEVICE, STORAGE BATTERY SYSTEM, AND STORAGE BATTERY CHARGING CONTROL METHOD

TECHNICAL FIELD

The present invention relates to a storage battery system charging control device, a storage battery system, and a storage battery charging control method.

BACKGROUND ART

In general, in a storage battery system including a lithium ion battery, etc., deterioration is promoted in a high-temperature highly-charged state. In the case of performing life prediction, generally, approximation is performed by root law. Therefore, there is a tendency that deterioration at the initial stage is great and then deterioration becomes gradual over time. In some technologies, when the deterioration is estimated to be great, the deterioration is reduced through charging/discharging control (mainly, charge voltage control and discharge voltage control) for the storage battery, and when the deterioration is estimated to be small, the charging/discharging control (mainly, charge voltage control and discharge voltage control) is expanded.

CITATION LIST

Patent Document

Patent Document 1: Japanese Laid-Open Patent Publication No. 2013-65481 (FIG. 1)

SUMMARY OF THE INVENTION

Problems to be Solved by the Invention

The storage battery system including a lithium ion battery, etc., has a problem that the degree of deterioration is great in a high-temperature highly-charged state. When the degree of deterioration in the storage battery system is estimated to be great, charging/discharging control (mainly, charge voltage control and discharge voltage control) of the storage battery system is performed to reduce the deterioration and reduce the charge state of the storage battery system, whereby deterioration of the storage battery system can be suppressed. However, if the charge state is reduced in view of only suppression of deterioration of the storage battery system, the capacity of the storage battery system in one cycle is reduced, and further, a cumulative capacity until the end of life is also reduced.

The invention of the present disclosure has been made to solve the above problem, and an object of the invention of the present disclosure is to provide: a storage battery system charging/discharging control device which estimates a cumulative capacity until the end of life and controls the charge state of the storage battery system so that the estimated cumulative capacity increases, in order to suppress deterioration of the storage battery system; a storage battery system including the storage battery system charging/discharging control device; and a charging/discharging control method for the storage battery system.

Solution to the Problems

A storage battery system charging control device according to the invention of the present disclosure includes: a power estimation unit configured to store power data of a storage battery detected by a state detection unit of a storage battery unit, and calculate power until an end of life of the storage battery, as estimated power data, on the basis of the power data; an ambient temperature estimation unit configured to acquire ambient temperature prediction information, and calculate an ambient temperature until the end of life of the storage battery, as estimated ambient temperature data, on the basis of the ambient temperature prediction information; a temperature estimation unit configured to calculate a temperature of the storage battery until the end of life of the storage battery, as estimated storage battery temperature data, on the basis of the estimated power data and the estimated ambient temperature data; a data storage unit configured to store a deterioration coefficient corresponding to a temperature of the storage battery and a state of charge of the storage battery; a capacity retention calculation unit configured to acquire the deterioration coefficient and the estimated storage battery temperature data, and on the basis of the deterioration coefficient and either one of an operation time period until the end of life of the storage battery or a number of cycles until the end of life of the storage battery, using the state of charge as a parameter, sequentially calculate capacity retention data with respect to each state of charge until the end of life of the storage battery; a cumulative capacity calculation unit configured to calculate a cumulative capacity corresponding to each state of charge, on the basis of a rated capacity of the storage battery and the capacity retention data; and a charging control voltage determination unit configured to determine charging control voltage on the basis of the cumulative capacities corresponding to the respective states of charge.

A storage battery system according to the invention of the present disclosure includes: a storage battery unit including a storage battery and a state detection unit for detecting storage battery data of the storage battery; the storage battery system charging control device for performing charging/discharging control of the storage battery; and a system controller for control monitoring, configured to connect the storage battery system charging control device and the storage battery unit.

A storage battery charging control method according to the invention of the present disclosure includes the steps of: a state detection unit detecting power data of a storage battery; a power estimation unit storing the power data and calculating power until an end of life of the storage battery, as estimated power data, on the basis of the power data; an ambient temperature estimation unit acquiring ambient temperature prediction information and calculating an ambient temperature until the end of life of the storage battery, as estimated ambient temperature data, on the basis of the ambient temperature prediction information; a temperature estimation unit calculating a temperature of the storage battery until the end of life of the storage battery, as estimated storage battery temperature data, on the basis of the estimated power data and the estimated ambient temperature data; a capacity retention calculation unit acquiring a deterioration coefficient corresponding to a state of charge of the storage battery and the estimated storage battery temperature data; the capacity retention calculation unit calculating capacity retention data until the end of life of the storage battery, using the state of charge as a parameter, on the basis of the deterioration coefficient and either one of an operation time period until the end of life of the storage battery or a number of cycles until the end of life of the storage battery; a cumulative capacity calculation unit calculating a cumulative capacity on the basis of a rated capacity of the storage battery and the capacity retention data; the cumulative capacity calculation unit sequentially calculating the cumulative capacity corresponding to each state of charge until the end of life of the storage battery; and a charging control voltage determination unit determining charging control voltage on the basis of the cumulative capacities corresponding to the respective states of charge.

Effect of the Invention

In the storage battery system charging control device according to the invention of the present disclosure, using the state of charge as a parameter, the cumulative capacity corresponding to each state of charge until the end of life of the storage battery is calculated to determine charging control voltage. Thus, the life and economy of the storage battery can be improved.

In the storage battery system according to the invention of the present disclosure, using the state of charge as a parameter, the cumulative capacity corresponding to each state of charge until the end of life of the storage battery is calculated to determine charging control voltage. Thus, the life and economy of the storage battery can be improved.

In the storage battery charging control method according to the invention of the present disclosure, using the state of charge as a parameter, the cumulative capacity corresponding to each state of charge until the end of life of the storage battery is calculated to determine charging control voltage. Thus, it becomes possible to perform charging/discharging control for the storage battery while taking the life and economy of the storage battery into consideration.

BRIEF DESCRIPTION OF THE DRAWINGS

FIG. 6 shows data of a cumulative capacity result for 1 to 2000 cycles in relation to SOC and temperature according to embodiment 1 of the present invention.

DESCRIPTION OF EMBODIMENTS

Hereinafter, storage battery system charging control devices and methods according to embodiments of the present invention will be described with reference to the drawings.

Embodiment 1

Figures 1, 2:
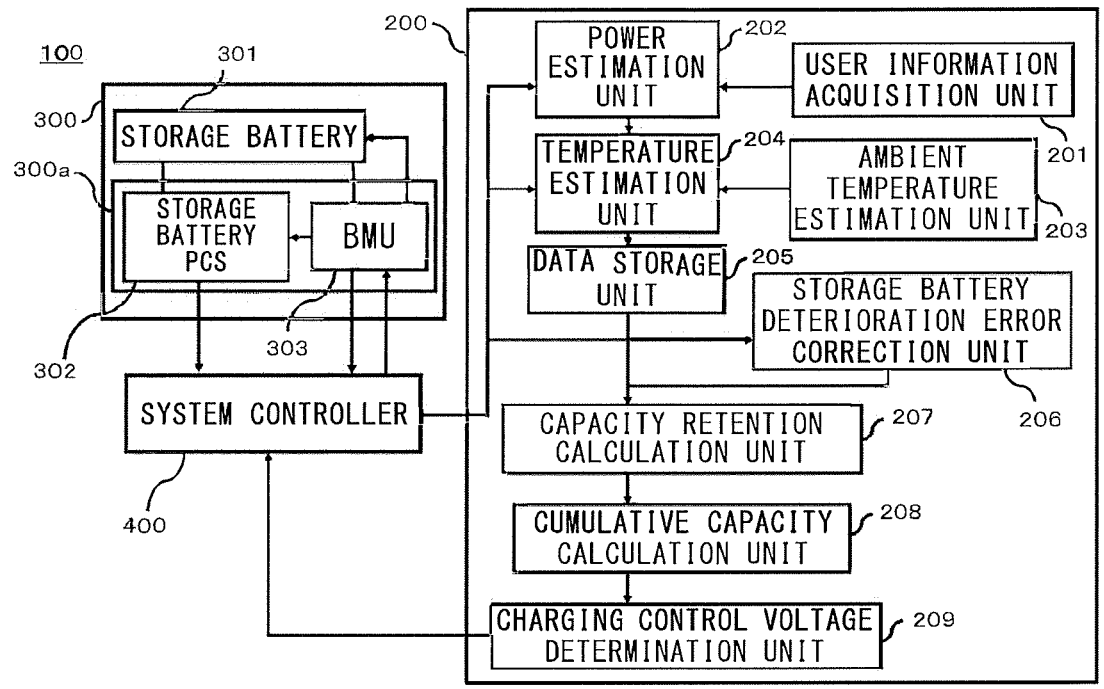
FIG. 1 is a schematic diagram of a storage battery system charging control device according to embodiment 1 of the present invention.
FIG. 2 shows deterioration coefficient table data according to embodiment 1 of the present invention.

FIG. 1 is a diagram schematically showing a storage battery system 100 according to embodiment 1 of the present invention. The description will be given using a storage battery system charging control device 200, a storage battery unit 300, and a system controller 400 shown in FIG. 1.

The storage battery system 100 includes the storage battery system charging control device 200, the storage battery unit 300, and the system controller 400. The storage battery system charging control device 200 is connected to the system controller 400 for control monitoring, and the system controller 400 for control monitoring is connected to the storage battery unit 300.

The configuration of the storage battery unit 300 will be described. The storage battery unit 300 includes a storage battery 301, a storage battery power conditioner (PCS) 302, and a battery management unit (BMU) 303. The storage battery PCS 302 and the BMU 303 constitute a state detection unit 300a for detecting state data of the storage battery 301 and storage battery data for estimating the state of the storage battery 301. Examples of the storage battery 301 include a lithium ion secondary battery, a nickel-metal hydride battery, a lead storage battery, a NAS battery, and a redox flow battery.

The storage battery PCS 302 has a function of converting current that flows to the storage battery 301, from AC to DC, and causing the converted current to flow into the storage battery 301, a function of monitoring input/output current and voltage to/from the storage battery 301, an ambient temperature measuring function, and the like. Each data of the storage battery 301 detected by the storage battery PCS 302 is managed with, for example, the date or the day of week when the data is detected, and is stored as past data. Each data of the storage battery 301 detected by the storage battery PCS 302 is outputted as storage battery data to the system controller 400 for control monitoring.

In order to protect the storage battery 301 so as not to cause over-charging, over-discharging, overvoltage, overcurrent, temperature abnormality, or the like of the storage battery 301, the BMU 303 has a function of monitoring the state of the storage battery 301, e.g., measuring voltage, measuring current, measuring power, measuring the temperature of the storage battery system, or managing the remaining capacity. Each data of the storage battery 301 detected by the BMU 303 is time-managed with, for example, the date or the day of week when the data is detected, and is stored as past data. Hereinafter, the various data of the storage battery 301 detected by the BMU 303 are collectively referred to as storage battery data. These storage battery data are outputted to the storage battery PCS 302 and the system controller 400 for control monitoring. The temperature of the storage battery 301 detected by the BMU 303 may be, for example, the average temperature, the module temperature, or the single-cell temperature of the storage battery 301. In the case of using the single-cell temperature, accuracy of estimation for capacity retention of the storage battery 301 is expected to be improved.

The storage battery system 100 operates as follows.

The storage battery data of the storage battery 301 detected by the storage battery PCS 302 and the BMU 303 included in the storage battery unit 300 are outputted to the system controller 400 for control monitoring.

The system controller 400 for control monitoring outputs the storage battery data outputted from the storage battery PCS 302 and the BMU 303, to the storage battery system charging control device 200. The storage battery system charging control device 200 determines charging control voltage on the basis of the data acquired by or stored in the storage battery system charging control device 200, including the storage battery data. The storage battery system charging control device 200 outputs the charging control voltage to the system controller 400 for control monitoring. The system controller 400 for control monitoring outputs the charging control voltage to the BMU 303. The BMU 303 performs charging/discharging control of the storage battery 301 on the basis of the charging control voltage.

Next, the configuration of the storage battery system charging control device 200 will be described. The storage battery system charging control device 200 includes a user information acquisition unit 201, a power estimation unit 202, an ambient temperature estimation unit 203, a temperature estimation unit 204, a data storage unit 205, a storage battery deterioration error correction unit 206, a capacity retention calculation unit 207, a cumulative capacity calculation unit 208, and a charging control voltage determination unit 209.

The user information acquisition unit 201 acquires, as user information, family information, information about devices connected to the storage battery system 100, and the like. It suffices that the user information can be acquired only once at the start of control of the storage battery system 100. However, the user information may be acquired every time the storage battery system 100 performs control. It is noted that the family information is not essential information, though it is desirable that the family information can be acquired.

The power estimation unit 202 calculates estimated power data of the storage battery 301 until the end of life of the storage battery 301, on the basis of power data which is one of the storage battery data of the storage battery 301 acquired via the system controller 400 for control monitoring. At the beginning of operation of the storage battery system 100, if power data has not been outputted from the storage battery PCS 302, the estimated power data of the storage battery 301 until the end of life of the storage battery 301 is estimated on the basis of the user information acquired by the user information acquisition unit. The estimated power data may be calculated on the basis of the user information and the power data outputted from the storage battery PCS 302.

Although differing depending on the intended use of the storage battery system, the life of the storage battery is prescribed by usable years or usage cycles in which the capacity retention will be kept at 60% or higher. For example, in the case of a stationary storage battery system, the life is often prescribed such that the capacity retention after ten years is not less than 60%, and in the case of a home electric mechanical appliance, the life is often prescribed such that the capacity retention after usage for 2000 times is not less than 80% or 60%. The capacity retention represents the proportion of the present capacity of the storage battery system, with respect to the capacity thereof at the beginning of operation which is defined as 100. A storage battery deterioration rate is represented by (100−capacity retention).

The ambient temperature estimation unit 203 calculates an ambient temperature until the end of life of the storage battery 301, as estimated ambient temperature data, on the basis of ambient temperature prediction information. As the ambient temperature prediction information, weather forecast prediction data, past weather data, weather change prediction data from the weather bureau, or the like can be used. The estimated ambient temperature data until the end of life of the storage battery 301 is calculated on the basis of one or a plurality of data such as weather forecast prediction data, past weather data, and weather change prediction data from the weather bureau. As the ambient temperature prediction information used for the ambient temperature estimation unit 203 to estimate the ambient temperature, the latest data can be acquired from the website of the weather bureau or the like via the Internet or the like, for example.

The temperature estimation unit 204 stores, as retained data, temperature data of the storage battery 301 when power of a certain value is applied to the storage battery 301 under a certain ambient temperature. In addition, the temperature estimation unit 204 stores, as past temperature data of the storage battery 301, temperature data which is one of the storage battery data of the storage battery 301 outputted from the system controller 400 for control monitoring.

The temperature estimation unit 204 compares the temperature data in the storage battery data acquired via the system controller 400 for control monitoring, the estimated power data of the storage battery until the end of life of the storage battery 301, outputted from the power estimation unit 202, and the estimated ambient temperature data until the end of life of the storage battery 301, outputted from the ambient temperature estimation unit 203, with the retained data stored in the temperature estimation unit 204, thereby calculating estimated storage battery temperature data of the storage battery 301 until the end of life of the storage battery 301. As the degree of deterioration of the storage battery 301 increases, heat generated in the storage battery 301 also increases. Therefore, if estimation for the temperature of the storage battery 301 is continued using the retained data which is the temperature data of the storage battery 301 when power of a certain value is applied to the storage battery 301 under a certain ambient temperature at the beginning of usage of the storage battery system 100, there is a possibility that error occurs. Therefore, using the past power data stored in the power estimation unit 202 and the past temperature data stored in the temperature estimation unit 204, the retained data in the temperature estimation unit 204 is corrected as necessary, thereby correcting the error.

The data storage unit 205 stores deterioration coefficients corresponding to various values of the temperature and various values of the state of charge (hereinafter, referred to as SOC) of the storage battery 301. The deterioration coefficients are coefficients depending on the temperature and the state of charge (SOC) of the storage battery 301, and are acquired through a life test of the storage battery 301 in advance. It is noted that the state of charge (SOC) is represented by a proportion of the charged electric amount with respect to the capacity of the storage battery, where a fully charged state is defined as 100 (%). The data storage unit 205 stores the deterioration coefficients as table data shown in FIG. 2.

The storage battery deterioration error correction unit 206 calculates and stores the capacity retention of the storage battery 301 at present, on the basis of the voltage data, the temperature data, and the current data in the storage battery data of the storage battery 301 detected by the BMU 303 and outputted from the storage battery PCS 302. As the storage battery capacity retention calculation method for the storage battery 301, a general method may be used.

The capacity retention calculation unit 207 calculates capacity retention data until the end of life of the storage battery 301, on the basis of the deterioration coefficient stored in the data storage unit 205 and the estimated storage battery temperature data until the end of life of the storage battery 301, calculated by the temperature estimation unit 204. As the capacity retention calculation method, a general method may be used.

The storage battery deterioration error correction unit 206 compares the capacity retention data of the storage battery

301 at present, calculated by the storage battery deterioration error correction unit 206, with the capacity retention data until the end of life, calculated by the capacity retention calculation unit 207, and if there is error therebetween, the storage battery deterioration error correction unit 206 calculates correction data. The capacity retention calculation unit 207 also has a function of correcting the capacity retention data on the basis of the correction data calculated by the storage battery deterioration error correction unit 206.

Figure 3:
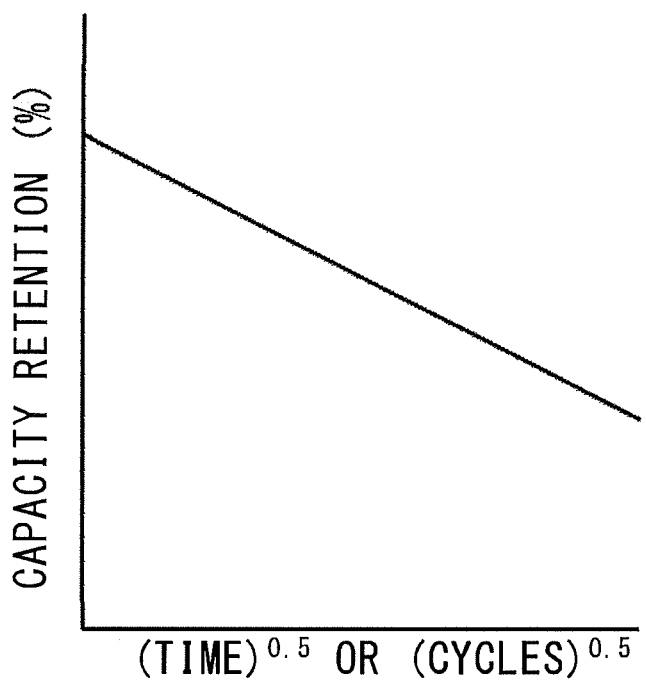
FIG. 3 shows an example of capacity retention transition according to embodiment 1 of the present invention.

The root law, which is a general calculation method for the capacity retention, will be described below. Calculation for the capacity retention data is performed on the basis of the estimated storage battery temperature data of the storage battery 301 until the end of life of the storage battery 301, estimated by the temperature estimation unit 204, and the deterioration coefficient stored in the data storage unit 205. As shown in FIG. 3, in the case where the capacity retention is plotted with the square root of time or charging cycles set for the horizontal axis, it is known that the capacity retention linearly deteriorates with respect to the square root of time or charging cycles. The temporal criterion may be either elapsed time or the number of charging cycles. Hereinafter, the case of using the number of cycles as the temporal criterion will be described.

A formula for estimating the capacity retention is represented by Expression (1).

[Mathematical 1]

$$Yn = a(T, SOC)n^{0.5} + b_n \quad (1)$$

In Expression (1), Yn is the capacity retention of the storage battery 301, a(T, SOC) is the deterioration coefficient depending on the temperature and the SOC of the storage battery 301, n is the number of cycles, and bn is a constant. The capacity retention Yn is estimated on the basis of the number n of cycles and deterioration coefficient a(T, SOC) of the storage battery 301.

For example, at the beginning of operation of the storage battery system 100, the number n of cycles is 0, and since there is no deterioration in the storage battery 301 at the beginning of operation, $Y_0$ is 100, and from Expression (1), $b_0=100$ is obtained.

The deterioration coefficient a(T, SOC) is table data stored in the data storage unit 205. FIG. 2 shows an example of the table data. The capacity retention calculation unit 207 acquires the estimated storage battery temperature data estimated by the temperature estimation unit 204, and the deterioration coefficient a(T, SOC) corresponding to each SOC data stored in the data storage unit 205, and calculates the capacity retention data corresponding to the SOC until the end of life of the storage battery 301, on the basis of the number n of cycles until the end of life of the storage battery 301 and the deterioration coefficient a(T, SOC). That is, using the SOC (0 to 100%) as a parameter, the capacity retention data corresponding to each SOC is sequentially calculated. In the case where the correction data is outputted from the storage battery deterioration error correction unit 206, the value Yn in Expression (1) is corrected on the basis of the correction data and the capacity retention is calculated accordingly.

In the storage battery system charging control device according to embodiment 1, the capacity retention data corresponding to each SOC as described above is sequentially calculated with respect to the estimated storage battery temperature data estimated by the temperature estimation unit 204. Further, with T set as an estimated temperature Te until the end of life, the capacity retention data of the storage battery 301 corresponding to each SOC (0 to 100%) as described above is calculated. The estimation formula is represented by Expression (2), and calculation of the capacity retention is performed for each number n of cycles.

[Mathematical 2]

$$Yn = a(Te, 0)n^{0.5} + b_n \quad (2)$$
$$\vdots$$
$$Yn = a(Te, 100)n^{0.5} + b_n$$

The cumulative capacity calculation unit 208 calculates a cumulative capacity corresponding to each SOC (0 to 100%) on the basis of a rated capacity q0 of the storage battery 301 and the capacity retention data Yn calculated for each SOC by the capacity retention calculation unit 207 using the SOC (0 to 100%) as a parameter. It is noted that the rated capacity q0 of the storage battery 301 is the capacity of the maximum applicable load for the storage battery 301 in the case where there is no deterioration in the storage battery. In addition, the cumulative capacity is a value obtained by accumulating the value of current that can be discharged from the storage battery within a predetermined SOC range. The capacity of the storage battery 301 that can be used in one cycle is limited by storage battery deterioration and the SOC of the storage battery 301, and is calculated by a product of the rated capacity q0 of the storage battery 301, the capacity retention data Yn, and SOCn. It is noted that n represents the number of cycles until the end of life of the storage battery 301. A cumulative capacity Cn until the end of life of the storage battery 301 is calculated by Expression (3).

[Mathematical 3]

$$Cn = \sum_{k=1}^{n} (q0 \times Yk \times SOCk) \quad (3)$$

Figure 4:
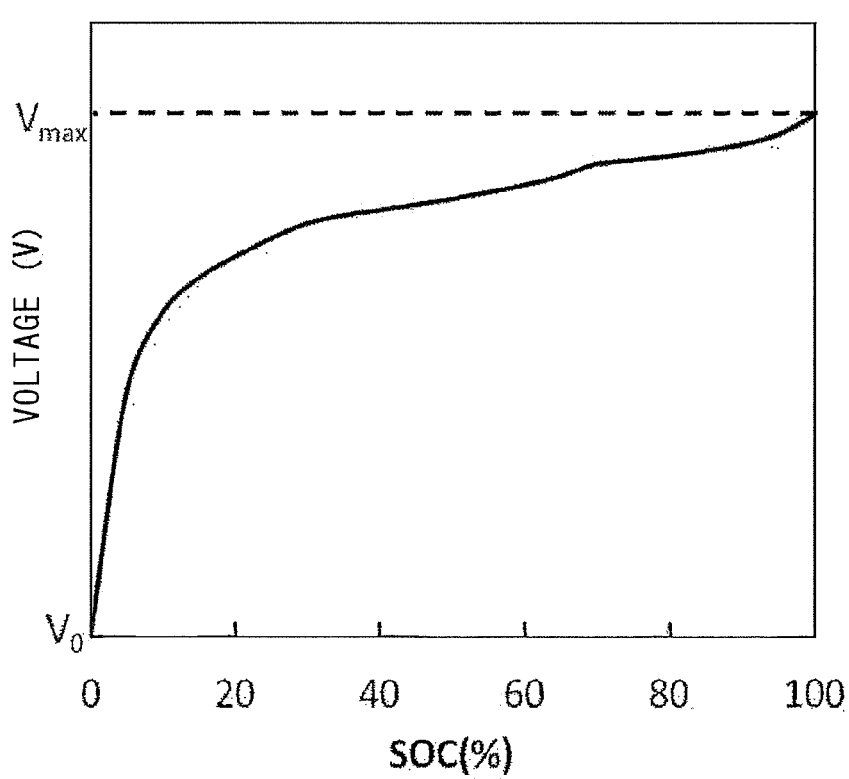
FIG. 4 shows an SOC-OCV curve of a storage battery system according to embodiment 1 of the present invention.

The charging control voltage determination unit 209 determines, as control state-of-charge, the SOC corresponding to the greatest cumulative capacity among the cumulative capacities for the respective values of the SOC (0 to 100%), calculated by the cumulative capacity calculation unit 208. The control state-of-charge is the state of charge (SOC) determined by the charging control voltage determination unit 209 and used for performing charging/discharging control of the storage battery 301. As each SOC, numerical values with steps by 5% between 0 to 100% may be used, for example. The control state-of-charge determined such that the cumulative capacity of the storage battery 301 is maximized is converted to voltage by using an SOC-OCV curve shown in FIG. 4, and the converted voltage is outputted, as charging control voltage, from the charging control voltage determination unit 209 via the system controller 400 for control monitoring to the storage battery unit 300 side, whereby the charging control voltage of the BMU 303 is updated. The BMU 303 executes charging/discharging of the storage battery 301 with the updated charging control voltage. The charging control voltage is a voltage value which is used for performing charging/discharging control of the storage battery 301 and which is obtained by converting the control state-of-charge determined by the charging control voltage determination unit 209, to a voltage value by using the SOC-OCV curve.

In the storage battery system charging control device and the storage battery system according to embodiment 1, the temperature estimation unit 204 calculates the estimated storage battery temperature data on the basis of the estimated power data calculated by the power estimation unit 202 and the estimated ambient temperature data calculated by the ambient temperature estimation unit 203. The capacity retention calculation unit 207 acquires the deterioration coefficient corresponding to the SOC and the estimated storage battery temperature data from the data storage unit 205, and calculates the capacity retention data corresponding to each SOC (0 to 100%) until the end of life of the storage battery 301, on the basis of the deterioration coefficient and either one of the operation time period until the end of life of the storage battery 301 or the number of cycles until the end of life of the storage battery 301. The cumulative capacity calculation unit 208 sequentially calculates the cumulative capacity for each SOC on the basis of the rated capacity and the capacity retention data of the storage battery 301, by using the SOC (0 to 100%) until the end of life of the storage battery 301 as a parameter. The charging control voltage determination unit 209 determines the SOC corresponding to the case where the cumulative capacity is maximized, from among the cumulative capacities corresponding to the respective values of the SOC. The storage battery system charging control device 200 according to embodiment 1 can determine the charging control voltage that maximizes the cumulative capacity until the end of life of the storage battery 301. Therefore, it becomes possible to maximize the cumulative capacity until the end of life of the storage battery system.

Figure 5:
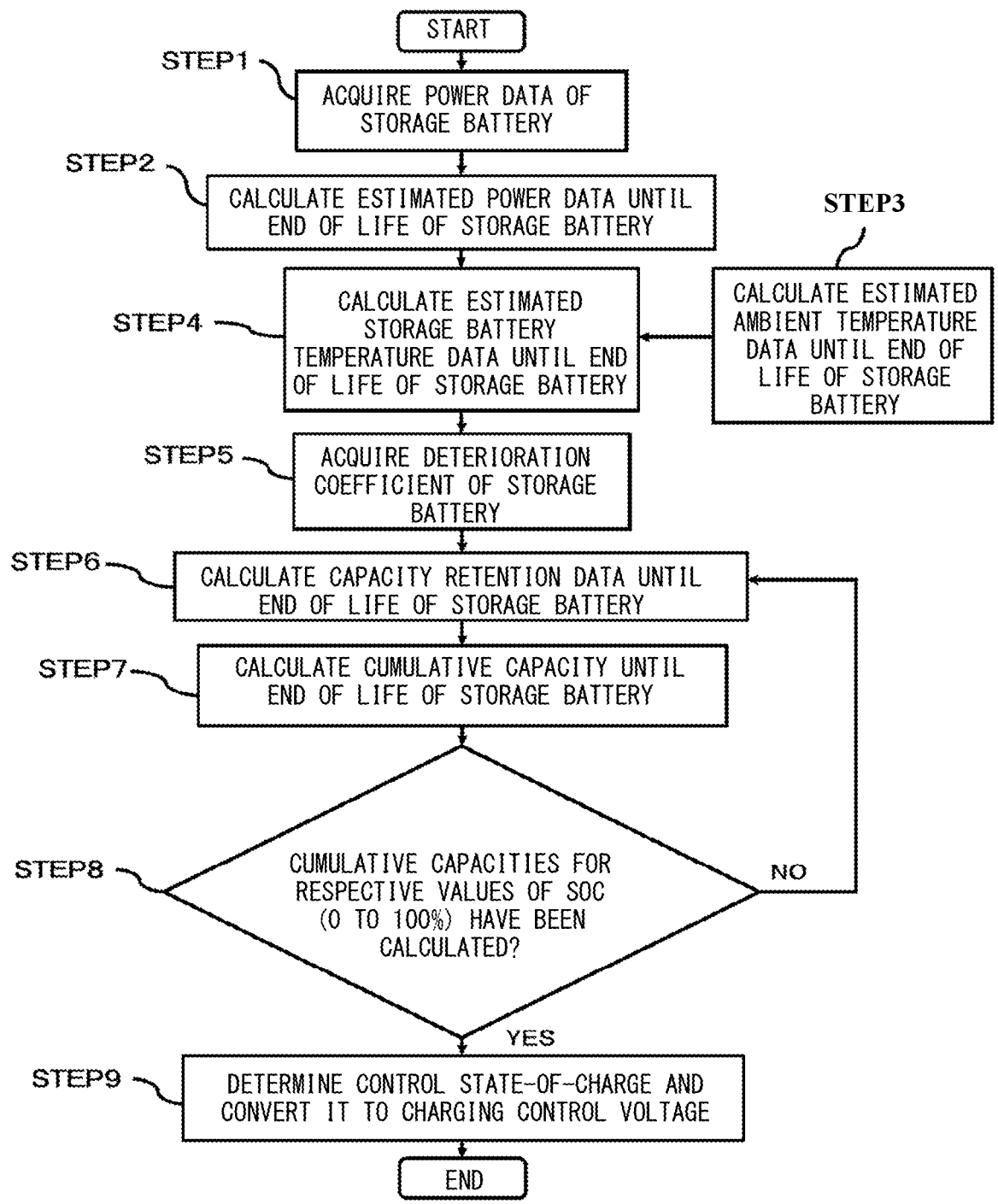
FIG. 5 is a flowchart showing storage battery charging control according to embodiment 1 of the present invention.

The charging/discharging control method for the storage battery system according to embodiment 1 will be described with reference to a flowchart for determining the charge voltage of the storage battery system 100, shown in FIG. 5.

When charging/discharging control of the storage battery system is started, in STEP 1, the state detection unit 300a in the storage battery unit 300 acquires power data which is one of the storage battery data of the storage battery 301.

In STEP 2, the power estimation unit 202 stores the acquired power data, and calculates the estimated power data until the end of life of the storage battery 301, on the basis of the acquired power data. It is noted that, in the case where the power data cannot be acquired by the state detection unit 300a at the beginning of operation, the estimated power data of the storage battery 301 until the end of life of the storage battery 301 is calculated on the basis of user information acquired by the user information acquisition unit 201.

In STEP 3, the ambient temperature estimation unit 203 calculates the estimated ambient temperature data until the end of life of the storage battery 301, on the basis of the ambient temperature prediction information acquired from outside.

In STEP 4, the temperature estimation unit 204 calculates the estimated storage battery temperature data until the end of life of the storage battery 301, on the basis of the estimated power data calculated in STEP 2 and the estimated ambient temperature data calculated in STEP 3.

In STEP 5, the capacity retention calculation unit 207 acquires the estimated storage battery temperature data calculated in STEP 4, and the deterioration coefficient corresponding to each SOC stored in the data storage unit 205.

In STEP 6, the capacity retention calculation unit 207 calculates the capacity retention data until the end of life of the storage battery 301, using the SOC as a parameter, on the basis of the deterioration coefficient and either one of the operation time period until the end of life of the storage battery 301 and the number of cycles until the end of life of the storage battery 301.

In STEP 7, the cumulative capacity calculation unit 208 calculates the cumulative capacity on the basis of the rated capacity of the storage battery 301 and the capacity retention data calculated in STEP 6.

In STEP 8, the cumulative capacity calculation unit 208 sequentially calculates, for each SOC (0 to 100%), the cumulative capacity until the end of life of the storage battery 301.

In STEP 9, the charging control voltage determination unit 209 determines, as the control state-of-charge, the SOC corresponding to the case where the cumulative capacity is maximized, from the cumulative capacities corresponding to the respective values of the SOC (0 to 100%), calculated in STEP 8, and converts the control state-of-charge to charging control voltage on the basis of an SOC-OCV curve of the storage battery.

In energy-creation and energy-storage coordinated equipment, in the case of the storage battery system alone, the following charging method has been conventionally employed: during the period in which the electricity rate is low, power is stored until reaching the fully-charged state of the storage battery system, or if PV surplus power is generated, charging is performed with the PV surplus power until reaching the state of charge at the chargeable level. Thus, the control has been conventionally performed in terms of economy, not in terms of deterioration (life) of the storage battery system. However, hereafter, in equipment in which a plurality of energy storage devices, such as an electric water heater and a storage battery system, are coordinated, control for the storage battery system is performed by a control method in which the charging control voltage is determined using the storage battery system charging control device, the storage battery system, and the storage battery charging control method according to embodiment 1 so as to maximally improve the life and economy, whereby deterioration can be suppressed and the cumulative capacity until the end of life can be maximized.

In the storage battery system charging control device, the storage battery system, and the charging control method according to embodiment 1, the power data and the temperature data until the end of life of the storage battery 301 are estimated, and on the basis of the estimation result, the cumulative capacity corresponding to each SOC until the end of life of the storage battery 301 is calculated. Therefore, it is possible to control charging/discharging of the storage battery 301 so that the cumulative capacity until the end of life of the storage battery 301 is maximized. Further, since the charge state of the storage battery 301 can be optimally controlled, it is possible to reduce deterioration of the storage battery.

If the storage battery system charging control device, the storage battery system, and the charging control method according to embodiment 1 are applied, in a storage battery system such as a stationary storage battery system in which charging can be performed during a time period in which the electricity rate is low, the overall cumulative capacity until the end of life of the storage battery system is increased owing to the deterioration suppressing effect, thus providing an effect of reducing the electricity charge.

In the case of the storage battery system having two energy storage devices, it is possible to flexibly determine the state of charge for one of the energy storage devices, and minimization of the deterioration amount and maximization of the cumulative capacity of the storage battery system can be achieved.

The storage battery system according to the present disclosure is applicable to, for example, a home power storage system, or a storage battery system that performs charging for an electric vehicle or a hybrid car having a storage battery with use of a commercial power supply.

Example 1

Regarding the flowchart in FIG. 5, under the assumption that the rated capacity of the storage battery 301 is 30 Ah, the charging/discharging control method for the storage battery system will be described. In the present example, the life is 2000 cycles, and estimation intervals are divided on a 400-cycle basis. The estimation intervals may be shortened to 200 cycles, 100 cycles, or the like. Instead of the cycles, the axis of time (t) may be used.

The estimated storage battery temperature data is estimated from the estimated power data and the estimated ambient temperature data, in accordance with each number of cycles. In the present example, it is assumed that the storage battery 301 is used at 45° C. in 1st to 400th cycles, 25° C. in 401st to 800th cycles, 5° C. in 801st to 1200th cycles, 25° C. in 1201st to 1600th cycles, and 45° C. in 1601st to 2000th cycles. It is noted that the life of the storage battery 301 is set to 2000 cycles.

Calculation of the cumulative capacity of the storage battery 301 until reaching 2000 cycles which correspond to the life of the storage battery 301 is performed on the basis of the deterioration coefficients obtained through a life test in advance and retained in the data storage unit 205.

The capacity retention calculation unit 207 estimates the capacity retention for 1st to 400th cycles. In the present example, the deterioration coefficient of the storage battery 301 is set as −1 for the case where the temperature of the storage battery 301 is 25° C. and the SOC is 100%, and the calculation is performed under the assumption that the deterioration coefficient is doubled per 10° C. and the deterioration is accelerated by 1.5 times upon voltage increase from SOC 80% to SOC 100%. In actuality, it is desirable that the deterioration coefficient is calculated through a life test in advance. In the present example, it is assumed that the deterioration coefficient is doubled per 10° C. and the deterioration is accelerated by 1.5 times upon voltage increase from SOC 80% to SOC 100%. The temperature is set in steps of 5° C. between 5° C. and 45° C., and the SOC is set in steps of 5% between 0% and 100%. However, these values may be set in steps of 1° C. or 1%.

From Expression (1) which is the estimation formula for the capacity retention, the capacity retention for 1st to 400th cycles is calculated as follows.

$$Y_1 = a(T, SOC)n^{0.5} + b_0 = a(45°C., SOC)1^{0.5} + b_0$$
$$\vdots$$
$$Y_{400} = a(T, SOC)n^{0.5} + b_0 = a(45°C., SOC)400^{0.5} + b_0$$

Thus, the capacity retention calculation unit 207 estimates the capacity retention corresponding to each SOC. It is noted that the a(45° C.,SOC) is the deterioration coefficient when the temperature of the storage battery 301 is 45° C., and depends on the SOC. In addition, $b_0$ is calculated from the capacity retention of the storage battery 301 at the beginning of operation of the storage battery system, and therefore $b_0$ is 100. Further, $b_n$ is updated for cycles in each estimation interval, and is calculated from the capacity retention immediately before the cycles in each estimation interval. In the present example, $b_n$ is updated per 400 charging cycles. The capacity Qn for each cycle is calculated as a product of the capacity retention Yn and the rated capacity 30 Ah (n=1 to 400).

$$Qn = (a(45°C., SOC)n^{0.5} + b_0) \times 30 \times SOC$$

As for the cumulative capacity $C_{1\ to\ 400}$ in 1st to 400th cycles, the cumulative capacity calculation unit 208 accumulates the capacities for the respective cycles, to calculate the cumulative capacity corresponding to each SOC in 1st to 400th cycles, as shown by Expression (4).

[Mathematical 4]

$$C_{1-400} = \Sigma_{k=1}^{400}((a(45°C., SOC)k^{0.5} + b_0) \times 30 \times SOC) \quad (4)$$

Similarly, using the deterioration coefficient, the capacity retention for 401st to 800th cycles is calculated as follows.

$$Y_{401} = a(T, SOC)n^{0.5} + b_{400} = a(25°C., SOC)401^{0.5} + b_{400}$$
$$\vdots$$
$$Y_{800} = a(T, SOC)n^{0.5} + b_{400} = a(25°C., SOC)800^{0.5} + b_{400}$$

Thus, the capacity retention calculation unit 207 estimates the capacity retention depending on the SOC in the same manner as in 401st to 800th cycles. It is noted that the a(25° C., SOC) is the deterioration coefficient when the temperature of the storage battery 301 is 25° C., and depends on the SOC. In addition, $b_{400}$ is a constant calculated from the capacity retention at the 400th cycle, and is calculated as follows.

$$b_{400} = Y_{400} - a(45°C., SOC)400^{0.5} = 40.00$$

The capacity Qn for each cycle is calculated as a product of the capacity retention Yn and the rated capacity 30 Ah (n=401 to 800).

$$Qn = (a(25°C., SOC)n^{0.5} + b_{400}) \times 30 \times SOC$$

As for the cumulative capacity $C_{401\ to\ 800}$ in 401st to 800th cycles, the cumulative capacity calculation unit 208 accumulates the capacities for the respective cycles, to calculate the cumulative capacity corresponding to each SOC in 401st to 800th cycles, as shown by Expression (5).

[Mathematical 5]

$$C_{401-800} = \Sigma_{k=401}^{800}((a(25°C., SOC)k^{0.5} + b_{400}) \times 30 \times SOC) \quad (5)$$

Similarly, using the deterioration coefficient, the capacity retention for 801st to 1200th cycles is calculated as follows.

$$Y_{801} = a(T, SOC)n^{0.5} + b_{800} = a(5°C., SOC)801^{0.5} + b_{800}$$
$$\vdots$$
$$Y_{1200} = a(T, SOC)n^{0.5} + b_{800} = a(5°C., SOC)1200^{0.5} + b_{800}$$

Thus, the capacity retention calculation unit 207 estimates the capacity retention corresponding to each SOC in the same manner as in 801st to 1200th cycles. It is noted that the a(5° C., SOC) is the deterioration coefficient when the temperature of the storage battery 301 is 5° C., and depends on the SOC. In addition, $b_{800}$ is a constant calculated from the capacity retention at the 800th cycle, and is calculated as follows.

$$b_{800} = Y_{800} - a(25°C., SOC)800^{0.5} = 16.72$$

The capacity Qn for each cycle is calculated as a product of the capacity retention Yn and the rated capacity 30 Ah (n=801 to 1200).

$$Qn=(a(5° C., SOC)n^{0.5}+b_{800})\times 30\times SOC$$

As for the cumulative capacity $C_{801\ to\ 1200}$ in 801st to 1200th cycles, the cumulative capacity calculation unit 208 accumulates the capacities for the respective cycles, to calculate the cumulative capacity corresponding to each SOC in 801st to 1200th cycles, as shown by Expression (6).

[Mathematical 6]

$$C_{801-1200}=\Sigma_{k=801}^{1200}((a(5° C., SOC)k^{0.5}+b_{800})\times 30\times SOC) \qquad (6)$$

Similarly, using the deterioration coefficient, the capacity retention for 1201st to 1600th cycles is calculated as follows.

$$Y_{1201} = a(T, SOC)n^{0.5} + b_{1200} = a(25°C., SOC)1201^{0.5} + b_{1200}$$
$$\vdots$$
$$Y_{1600} = a(T, SOC)n^{0.5} + b_{1200} = a(25°C., SOC)1600^{0.5} + b_{1200}$$

Thus, the capacity retention calculation unit 207 estimates the capacity retention corresponding to each SOC. It is noted that the a(25° C., SOC) is the deterioration coefficient when the temperature of the storage battery 301 is 25° C., and depends on the SOC. In addition, $b_{1200}$ is a constant calculated from the capacity retention at the 1200th cycle, and is calculated as follows.

$$b_{1200}=Y_{1200}-a(5° C., SOC)1200^{0.5}=29.64$$

The capacity Qn for each cycle is calculated as a product of the capacity retention Yn and the rated capacity 30 Ah (n=1201 to 1600).

$$Qn=(a(25° C., SOC)n^{0.5}+b_{1200})\times 30\times SOC$$

As for the cumulative capacity $C_{1201\ to\ 1600}$ in 1201st to 1600th cycles, the cumulative capacity calculation unit 208 accumulates the capacities for the respective cycles, to calculate the cumulative capacity corresponding to each SOC in 1201st to 1600th cycles, as shown by Expression (7).

[Mathematical 7]

$$C_{1201-1600}=\Sigma_{k=1201}^{1600}((a(25° C., SOC)k^{0.5}+b_{1200})\times 30\times SOC) \qquad (7)$$

Similarly, using the deterioration coefficient, the capacity retention for 1601st to 2000th cycles is calculated as follows.

$$Y_{1601} = a(T, SOC)n^{0.5} + b_{1600} = a(45°C., SOC)1601^{0.5} + b_{1600}$$
$$\vdots$$
$$Y_{2000} = a(T, SOC)n^{0.5} + b_{1600} = a(45°C., SOC)2000^{0.5} + b_{1600}$$

Thus, the capacity retention calculation unit 207 estimates the capacity retention corresponding to each SOC. It is noted that the a(45° C., SOC) is the deterioration coefficient when the temperature of the storage battery 301 is 45° C., and depends on the SOC. In addition, $b_{1600}$ is a constant calculated from the capacity retention at the 1600th cycle, and is calculated as follows.

$$b_{1600}=Y_{1600}-a(25° C., SOC)1600^{0.5}=81.636$$

The capacity Qn for each cycle is calculated as a product of the capacity retention Yn and the rated capacity 30 Ah (n=1601 to 2000).

$$Qn=(a(45° C., SOC)n^{0.5}+b_{1600})\times 30\times SOC$$

As for the cumulative capacity $C_{1601\ to\ 2000}$ in 1601st to 2000th cycles, the cumulative capacity calculation unit 208 accumulates the capacities for the respective cycles, to calculate the cumulative capacity corresponding to each SOC in 1601st to 2000th cycles, as shown by Expression (8).

[Mathematical 8]

$$C_{1601-2000}=\Sigma_{k=1601}^{2000}((a(45° C., SOC)k^{0.5}+b_{2000})\times 30\times SOC) \qquad (8)$$

Next, the charging control voltage determination unit 209 determines the SOC that maximizes the cumulative capacity until the end of life of the storage battery 301, from among the cumulative capacities for the respective values of the SOC shown in FIG. 6, calculated by the cumulative capacity calculation unit 208. FIG. 6 shows a result of calculation of the cumulative capacities in 1st to 2000th cycles at each temperature, using the SOC as a parameter. Using the SOC as a parameter varying in steps of 5% from 0% to 100%, the cumulative capacity corresponding to each SOC is calculated. In 1st to 400th cycles, since the temperature of the storage battery 301 is estimated to be 45° C., the charging control voltage determination unit 209 determines, as the charging control voltage, the voltage value corresponding to SOC 85% at which the cumulative capacity is estimated to be maximized. In 401st to 1600th cycles, the charging control voltage determination unit 209 determines, as the charging control voltage, the voltage value corresponding to SOC 100% at which the cumulative capacity is estimated to be maximized. In 1601st to 2000th cycles, the charging control voltage determination unit 209 determines, as the charging control voltage, the voltage value corresponding to SOC 70% at which the cumulative capacity is estimated to be maximized. That is, the charging control voltage determination unit 209 determines optimum charging control voltage for each estimation interval (in the present embodiment, every 400 cycles). It is noted that the SOC determined in each cycle unit is converted to voltage in accordance with the SOC-OCV curve shown in FIG. 4.

Figure 7:
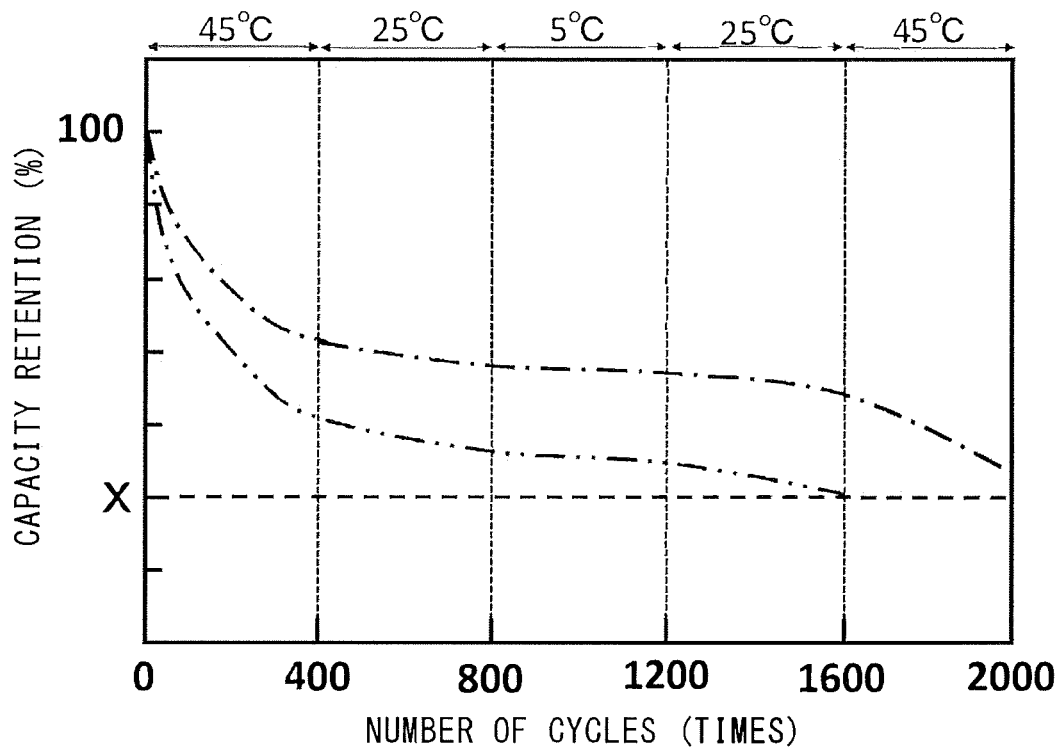
FIG. 7 shows transition of the storage battery system capacity retention in the case of applying the present control device according to embodiment 1 of the present invention, and in the case of not applying the same.
Figure 8:
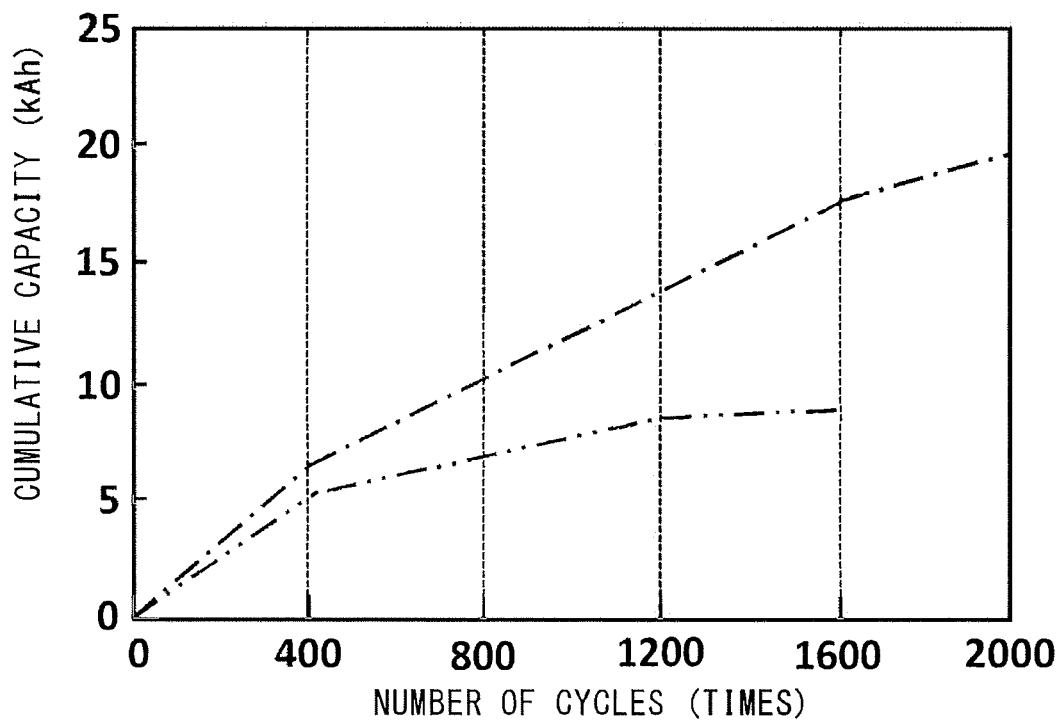
FIG. 8 shows transition of the storage battery system cumulative capacity in the case of applying the present control device according to embodiment 1 of the present invention, and in the case of not applying the same.

FIG. 7 shows capacity retention transition through the life of 2000 cycles of the storage battery 301, and FIG. 8 shows the cumulative capacity through the life of 2000 cycles of the storage battery 301. In FIG. 7, X indicates the end of life of the storage battery 301. For the purpose of comparison, the case of applying the storage battery system charging control device, the storage battery system, and the charging control method according to embodiment 1 is indicated by a dotted-dashed line, and the case of applying a storage battery system charging control device, a storage battery system, and a charging control method according to conventional art is indicated by a two-dot dashed line.

In the case of applying the storage battery system charging control device, the storage battery system, and the charging control method according to conventional art shown in FIG. 7, there is a tendency that the capacity retention of the storage battery 301 is sharply deteriorated in the 45° C. interval (1st to 400th cycles) in which the deterioration is estimated to be great because the estimated temperature is high.

On the other hand, in the case of applying the storage battery system charging control device according to embodiment 1, the charging control voltage is controlled in the 45° C. interval in which the deterioration is estimated to be great because the estimated temperature is high, thereby providing an effect of preventing reduction in the capacity retention. In addition, from the 401st cycle to the 2000th cycle which is the end of life, in the case of applying this control, there is a tendency that the deterioration is more gradual, and thus it is possible to keep target capacity retention until the end of life of 2000 cycles.

Here, the cumulative capacities in the case of applying the storage battery system charging control device, the storage battery system, and the storage battery charging control method according to embodiment 1, are calculated and compared with the cumulative capacities in the case of applying the conventional device and method. From the comparison, it is found that applying the invention of the present disclosure provides an effect of increasing the cumulative capacity, as shown in FIG. 8. In the present example, the test calculation has been performed with the cycles divided into 400-cycle intervals. However, it is desirable that the cycles are divided into intervals with fewer cycles in terms of estimation accuracy for power and temperature.

DESCRIPTION OF THE REFERENCE CHARACTERS

100 storage battery system
200 storage battery system charging control device
201 user information acquisition unit
202 power estimation unit
203 ambient temperature estimation unit
204 temperature estimation unit
205 data storage unit
206 storage battery deterioration error correction unit
207 capacity retention calculation unit
208 cumulative capacity calculation unit
209 charging control voltage determination unit
300 storage battery unit
300a state detection unit
301 storage battery
400 system controller

The invention claimed is:

1. A storage battery system charging control device comprising:
   a power estimator to store power data of a storage battery detected by a state detector of a storage battery unit, and calculate power until an end of life of the storage battery, as estimated power data, on the basis of the power data;
   an ambient temperature estimator to acquire ambient temperature prediction information, and calculate an ambient temperature until the end of life of the storage battery, as estimated ambient temperature data, on the basis of the ambient temperature prediction information;
   a temperature estimator to calculate a temperature of the storage battery until the end of life of the storage battery, as estimated storage battery temperature data, on the basis of the estimated power data and the estimated ambient temperature data;
   a data storage to store a deterioration coefficient corresponding to the temperature of the storage battery and a state of charge of the storage battery;
   a capacity retention calculator to acquire the deterioration coefficient and the estimated storage battery temperature data, and on the basis of the deterioration coefficient and either one of an operation time period until the end of life of the storage battery or a number of cycles until the end of life of the storage battery, using the state of charge as a parameter, sequentially calculate capacity retention data with respect to each state of charge until the end of life of the storage battery;
   a cumulative capacity calculator to calculate a cumulative capacity corresponding to each state of charge, on the basis of a rated capacity of the storage battery and the capacity retention data; and
   a charging control voltage determiner to determine charging control voltage on the basis of the cumulative capacities corresponding to the respective states of charge.

2. The storage battery system charging control device according to claim 1, wherein
   the charging control voltage determiner determines, as a control state-of-charge, the state of charge corresponding to the cumulative capacity that has the greatest value among the cumulative capacities corresponding to the respective states of charge, and converts the control state-of-charge to the charging control voltage.

3. The storage battery system charging control device according to claim 1, wherein
   the charging control voltage is re-calculated every time a predetermined operation time period of the storage battery or a predetermined number of cycles have passed.

4. The storage battery system charging control device according to claim 3, further comprising a storage battery deterioration error corrector to calculate capacity retention of the storage battery at a time of the re-calculation, on the basis of voltage data, current data, and temperature data of the storage battery detected by the state detector, and if there is error between the capacity retention and the capacity retention data calculated by the capacity retention calculator, calculate correction data for correcting the capacity retention data, wherein
   the capacity retention calculator further acquires the correction data calculated by the storage battery deterioration error corrector, and corrects the capacity retention data with respect to each state of charge until the end of life of the storage battery.

5. The storage battery system charging control device according to claim 2, wherein
   the charging control voltage is re-calculated every time a predetermined operation time period of the storage battery or a predetermined number of cycles have passed.

6. The storage battery system charging control device according to claim 5, further comprising a storage battery deterioration error corrector to calculate capacity retention of the storage battery at a time of the re-calculation, on the basis of voltage data, current data, and temperature data of the storage battery detected by the state detector, and if there is error between the capacity retention and the capacity retention data calculated by the capacity retention calculator, calculate correction data for correcting the capacity retention data, wherein
   the capacity retention calculator further acquires the correction data calculated by the storage battery deterioration error corrector, and corrects the capacity retention data with respect to each state of charge until the end of life of the storage battery.

7. The storage battery system charging control device according to claim 1, wherein
   the ambient temperature estimator calculates the ambient temperature until the end of life of the storage battery, as the estimated ambient temperature data, on the basis of one or more of weather forecast prediction data, past weather data, and weather change prediction data.

8. The storage battery system charging control device according to claim 1, further comprising a user information acquirer to acquire user information, wherein
in a case where charging of the storage battery has not been started yet, the power estimator calculates the estimated power data until the end of life of the storage battery, on the basis of the user information.

9. A storage battery system comprising:
a battery storage including a storage battery and a state detector to detect storage battery data of the storage battery;
a storage battery system charging controller to perform charging/discharging control of the storage battery; and
a system controller to control monitoring, configured to connect the storage battery system charging controller and the battery storage,
wherein the storage battery system charging controller includes:
a power estimator to store power data of the storage battery detected by the state detector of the battery storage, and calculate power until an end of life of the storage battery, as estimated power data, based on the power data,
an ambient temperature estimator to acquire ambient temperature prediction information, and calculate an ambient temperature until the end of life of the storage battery, as estimated ambient temperature data, based on the ambient temperature prediction information,
a temperature estimator to calculate a temperature of the storage battery until the end of life of the storage battery, as estimated storage battery temperature data, based on the estimated power data and the estimated ambient temperature data,
a data storage to store a deterioration coefficient corresponding to the temperature of the storage battery and a state of charge of the storage battery,
a capacity retention calculator to acquire the deterioration coefficient and the estimated storage battery temperature data, and based on the deterioration coefficient and either one of an operation time period until the end of life of the storage battery or a number of cycles until the end of life of the storage battery, using the state of charge as a parameter, sequentially calculate capacity retention data with respect to each state of charge until the end of life of the storage battery,
a cumulative capacity calculator to calculate a cumulative capacity corresponding to each state of charge, based on a rated capacity of the storage battery and the capacity retention data, and
a charging control voltage determiner to determine charging control voltage based on the cumulative capacities corresponding to the respective states of charge.

10. A storage battery charging control method comprising:
detecting power data of a storage battery;
storing the power data and calculating power until an end of life of the storage battery, as estimated power data, on the basis of the power data;
acquiring ambient temperature prediction information and calculating an ambient temperature until the end of life of the storage battery, as estimated ambient temperature data, on the basis of the ambient temperature prediction information;
calculating a temperature of the storage battery until the end of life of the storage battery, as estimated storage battery temperature data, on the basis of the estimated power data and the estimated ambient temperature data;
acquiring a deterioration coefficient corresponding to a state of charge of the storage battery and the estimated storage battery temperature data;
calculating capacity retention data until the end of life of the storage battery, using the state of charge as a parameter, on the basis of the deterioration coefficient and either one of an operation time period until the end of life of the storage battery or a number of cycles until the end of life of the storage battery;
calculating a cumulative capacity on the basis of a rated capacity of the storage battery and the capacity retention data;
sequentially calculating the cumulative capacity corresponding to each state of charge until the end of life of the storage battery; and
determining charging control voltage on the basis of the cumulative capacities corresponding to the respective states of charge.

\* \* \* \* \*